(12) United States Patent
Buer et al.

(10) Patent No.: US 7,583,150 B2
(45) Date of Patent: Sep. 1, 2009

(54) POWER EFFICIENT MULTISTAGE AMPLIFIER AND DESIGN METHOD

(75) Inventors: Kenneth V Buer, Gilbert, AZ (US); Michael Lyons, Gilbert, AZ (US); Scarlet Daoud, Mesa, AZ (US)

(73) Assignee: ViaSat, Inc., Carlsbad, CA (US)

( * ) Notice: Subject to any disclaimer, the term of this patent is extended or adjusted under 35 U.S.C. 154(b) by 52 days.

(21) Appl. No.: 11/688,729

(22) Filed: Mar. 20, 2007

(65) Prior Publication Data
US 2008/0231374 A1 Sep. 25, 2008

(51) Int. Cl.
*H03F 3/68* (2006.01)
(52) U.S. Cl. .................. 330/310; 330/133; 330/150
(58) Field of Classification Search ............ 330/285, 330/310–311, 296
See application file for complete search history.

(56) References Cited

U.S. PATENT DOCUMENTS

| | | | | |
|---|---|---|---|---|
| 5,889,434 | A * | 3/1999 | Shimura et al. | 330/302 |
| 7,157,974 | B2 * | 1/2007 | Grillo et al. | 330/285 |
| 7,193,459 | B1 * | 3/2007 | Epperson et al. | 330/130 |
| 7,385,447 | B1 * | 6/2008 | Adar | 330/149 |

FOREIGN PATENT DOCUMENTS

WO 01/84704 A 11/2001

OTHER PUBLICATIONS

Che-Hung Lin et al: "A Compact 6.5-W PHEMT MMIC Power Amplifier for Ku-Band Applications" IEEE Microwave and Wireless Components Letters, IEEE Service Center, New York, NY, US, vol. 17, No. 2, Feb. 1, 2007, pp. 154-156, XP011161853 ISSN: 1531-1309.

Chen-Kuo Chu et al: "A 9.1-10-7 GHz 10-W, 40-dB Gain Four-Stage PHEMT MMIC Power Amplifier" IEEE Microwave and Wireless Components Letters, IEEE Service Center, New York, NY, US, vol. 17, No. 2, Feb. 1, 2007, pp. 151-153, XP011161844 ISSN: 1531-1309.

Ali Mohamed Darwish et al: A1/GaN-Band 5-W MMIC Amplifier IEEE Transactions on Microwave Theory and Techniques, IEEE Service Center, Piscataway, NJ, US, vol. 46, No. 12, Dec. 1, 2006, pp. 4456-4463, XP011144621 ISSN: 0018-9480.

(Continued)

*Primary Examiner*—Robert Pascal
*Assistant Examiner*—Hieu P Nguyen
(74) *Attorney, Agent, or Firm*—Snell & Wilmer L.L.P.

(57) ABSTRACT

A multistage amplifier and design method are disclosed. The multistage amplifier has a plurality of amplifier stages, each stage having an amplifier designed and biased to operate at or near the amplifier's power added efficiency (PAE) peak. The PAE peak of each of the amplifier is at or near the amplifiers linear-compression transition region, providing a multistage power amplifier that is power efficient and has desirable amplitude to amplitude and amplitude to phase power transfer characteristics. The amplifier is designed by matching the output impedance of a final stage with a load. Amplifier stages are iteratively designed from the last stage to the first. At each stage, an amplifier and drive circuit are designed. The drive circuit and amplifier are designed to provide each stage with output impedance matched to the input impedance of the following stage and to operate at or near the PAE peak of the amplifier.

12 Claims, 5 Drawing Sheets

OTHER PUBLICATIONS

Liu H Z et al: "A four-stage ku-band 1 watt PHEMT MMIC power amplifier" GAAS IC Symposium. 24th. Annual IEEE Gallium Arsenide Integrated Circuit Symposium. Technical Digest 2002. Monterey, CA, Oct. 20-23, 2002; (GAAS IC Symposium—IEEE Gallium Arsenide Integrated Circuit Symposium), New York, NY: IEEE, US, Oct. 20, 2002, pp. 33-36, XP010616117 ISBN: 978-0-7803-7447-8.

Inque T et al: "High-gain wideband V-band multi-stage power MMICs" Millimeter Waves, 1997 Topical Symposium on Kanagawa, Japan Jul. 7-8, 1997, New York, NY, USA, IEEE, US, Jul. 7, 1997, pp. 40-43, XP010289064 ISBN: 978-0-7803-3887-6.

Rippke I et al: "A fully integrated, single-chip handset power amplifier in SiGe BiCMOS for W-CDMA applications" 2003 IEEE MTT-S International Microwave Symposium Digest. (IMS 2003). Philadelphia, PA, Jun. 8-13, 2003; [IEEE MTT-S International Microwave Symposium], New York, NY: IEEE, US, vol. 1, Jun. 8,2003, pp. a153-a156, XP010644779 ISBN: 978-0-7803-7695-3.

Debopriyo Chowdhury et al: "A 60GHz 1V+ 12.3dBm Transformer-Coupled Wideband PA in 90nm CMOS" Solid-State Circuits Conference, 2008. ISSCC 2008. Digest of Technical Papers. IEEE International, IEEE, Piscataway, NJ, USA, Feb. 3, 2008, pp. 560-635, XP031253792 ISBN: 978-1-4244-2010-0.

* cited by examiner

US 7,583,150 B2

POWER EFFICIENT MULTISTAGE AMPLIFIER AND DESIGN METHOD

FIELD OF INVENTION

The present invention is related to multistage amplifiers. More particularly the invention relates to multistage amplifiers that are power efficient.

BACKGROUND OF THE INVENTION

Multistage amplifiers are used in many applications where power is limited. For example, most space vehicles have only solar panels and batteries for gathering and storing power for all systems on the space vehicle. Space vehicles frequently have a communication system for communicating with earth or other space vehicles. The communication system has one or more power amplifiers for amplifying signals to be transmitted. The power amplifiers are ideally very small and very power efficient to conserve space and power on the space vehicle. The power amplifiers must also be able to amplify high frequency signals, often in the microwave and millimeter wave frequency bands. Monolithic microwave integrated circuit (MMIC) technology is often used to fabricate these power amplifiers in a small package. The power amplifiers may be fabricated using a gallium arsenide substrate to help meet stringent power, power efficiency and noise design requirements.

There are many techniques for improving the efficiency of power amplifiers. One technique for increasing power efficiency is conduction angle biasing. Conduction angle biasing generally involves amplifying only a portion of the input signal. Class AB amplifiers conduct and amplify between fifty and one hundred percent of the input signal. Class B amplifiers conduct and amplify about fifty percent of the input signal. Class C amplifiers conduct and amplify less than fifty percent of the input signal. A common characteristic of these conduction angle bias amplifiers is significant distortion of the output power relative to the input power. The distorted output provides the amplifier with undesirable amplitude modulation to amplitude modulation (AM-AM) and amplitude modulation to phase modulation (AM-PM) conduction and amplification characteristics.

Conventional power amplifiers such as Doherty amplifiers, Chireix out-phasing amplifiers and Envelope Elimination and Restoration (EER) amplifiers also suffer from poor AM-AM and AM-PM transfer characteristics. Moreover, these amplifiers and other conventional power efficient amplifiers are large, complex, or expensive and have limited input ranges and bandwidths.

Thus, there is a need for a power efficient amplifier having good AM-AM and AM-PM power transfer characteristics, but still keeping the amplifier small. The invention addresses this need as well as others.

SUMMARY OF THE INVENTION

A power efficient multistage power amplifier is realized through a plurality of stages, each stage having an amplifier and a drive circuit that biases the amplifier to operate at or near the amplifier's power added efficiency (PAE) peak. The PAE peak of many amplifiers is at or near the amplifier's linear-compression transition region. In this region, the amplifiers have good AM-AM and AM-PM transfer characteristics. Use of these amplifiers in each stage of the multistage amplifier provides power efficiency and a desirable power transfer characteristic.

To design the multistage power amplifier, the output impedance of the amplifier in the final stage is matched to the input impedance of a load. The final stage amplifier is designed to operate at or near its PAE peak. The final stage amplifier is biased with a final stage drive circuit that feeds the power output of a penultimate stage into the final stage amplifier. The penultimate stage amplifier is also designed to operate at or near its PAE peak and to have output impedance that substantially matches the input impedance of the final stage. The penultimate stage amplifier is biased with a penultimate stage drive circuit that feeds power into the penultimate stage amplifier. Earlier stages, if any, may be successively designed to provide the multistage power amplifier with more power amplification.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION OF EXEMPLARY EMBODIMENTS

While exemplary embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

Figure 1:
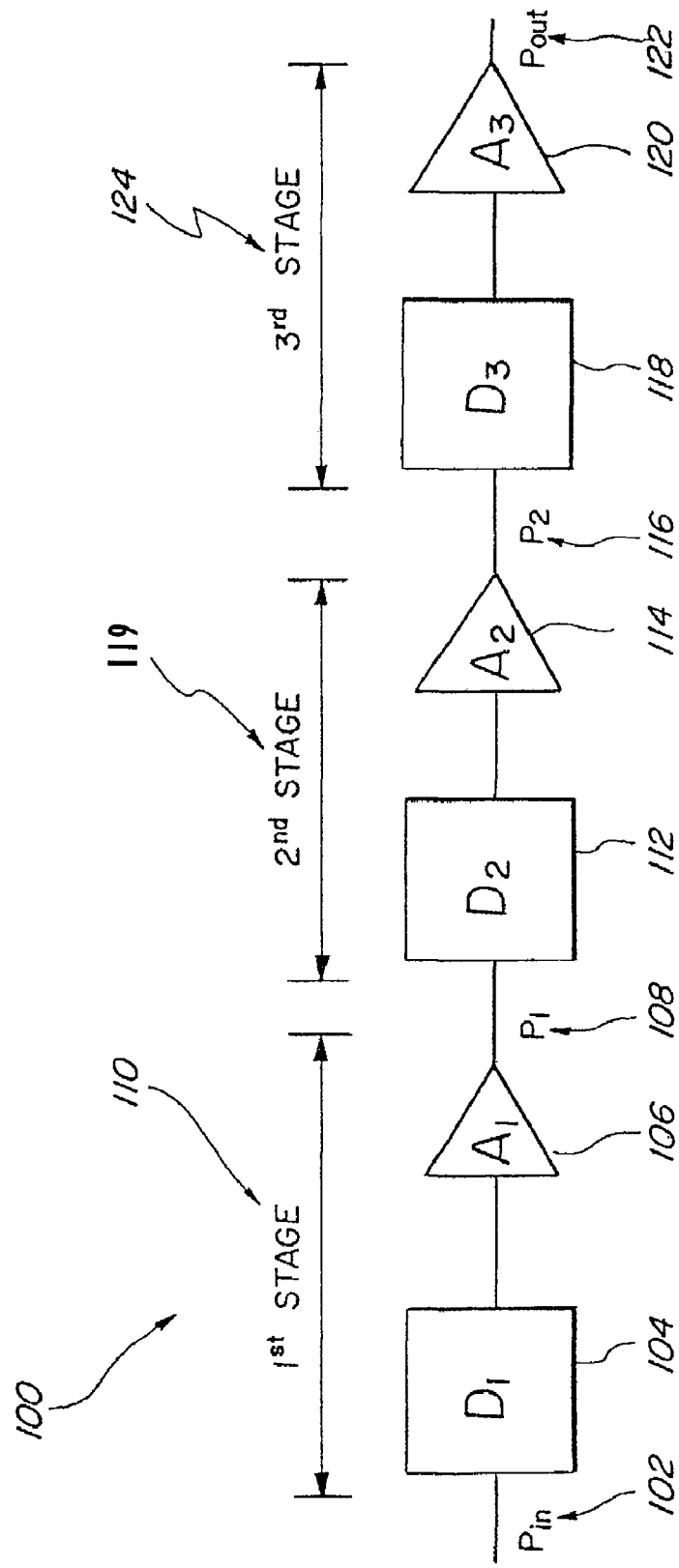
FIG. 1 shows a block diagram of an exemplary power efficient multistage amplifier according to an exemplary embodiment of the present invention.

FIG. 1 shows a multistage amplifier 100 according to an exemplary embodiment of the present invention. Multistage amplifier 100 may comprise an input 102 and an output 122. In one exemplary embodiment, multistage amplifier 100 further comprises a first stage 110, a second stage 119, and a third stage 124. In this embodiment, each of the first, second, and third stages comprises an input and an output. The output 108 of first stage 110 is connected to the input of second stage 119, and the output of second stage 119 is connected to the input of third stage 124. Thus, in this exemplary embodiment, stages 110, 119, 124 are connected in series. Alternate embodiments may include amplifiers connected in parallel as well as fewer or additional stages of amplification.

Furthermore, each stage 110, 119, 124 may comprise a drive circuit and an amplifier. For example, first stage 110 may comprise a first drive circuit 104 and a first amplifier 106. Similarly, second stage 119 may comprise a second drive circuit 112 and a second amplifier 114, and third stage 124 may comprise a third drive circuit 118 and a third amplifier 120. In each stage, the output of drive circuit 104, 112, 118 may be connected to the input of amplifier circuit 106, 114, 120, respectively.

Thus, in accordance with an exemplary embodiment of the present invention, first stage 110 is configured to receive an input power (Pin) at first stage input 102 and provide an amplified output power (P1) at first stage Output 108. More specifically, first drive circuit 104 is configured to receive input power (Pin) and drive first amplifier 106. First amplifier 106 is configured to amplify the input power (Pin) and output a first stage output power (P1) at first stage output 108.

Similarly, the first output power (P1) at first stage output 108 is provided to second drive circuit 112, which is configured to drive second amplifier 114. Second amplifier 114 is configured to amplify the first output power (P1) and output a second stage output power (P2) at second stage output 116.

Similarly, the second output power (P2) at second stage output 116 is provided to third drive circuit 118, which is configured to that drive third amplifier 120. Third amplifier 120 is configured to amplify the second output power (P2) and output an output power (Pout) at multistage amplifier output 122. Together the third drive circuit 18 and the third amplifier 120 form a third stage 124 of the multistage amplifier 100.

Multistage amplifier 100 may comprise any amplifier device that has more than one amplifier stage. In one exemplary embodiment, multistage amplifier 100 is a MMIC. However, multistage amplifier 100 is made, in other embodiments, of discrete electrical components and/or a combination of integrated circuit components and discrete components. The integrated circuit components may be of any suitable type. In one exemplary embodiment, the integrated circuit is fabricated on a gallium arsenide substrate; however, other types of substrates may be used.

Drive circuits 104, 112, 118 deliver power and bias amplifiers 106, 114, 120. Drive circuits 104, 112, 118 include circuitry that biases and delivers power to the transistors.

In accordance with an exemplary embodiment of the present invention, the amplifiers of multistage amplifier 100 may comprise any standard amplifier. For example, amplifiers 106, 114, 120 may comprise Field Effect Transistors (FETs). Exemplary FETs may include pseudomorphic High Electron Mobility Transistors (pHEMTs) or metamorphic High Electron Mobility Transistors (mHEMTs). Moreover, amplifiers 106, 114, 120 may comprise any other integrated circuit devices that are configured to amplify power.

In accordance with an exemplary embodiment of the present invention, amplifiers 106, 114, 120 are driven at or near their PAE peaks (explained hereinafter) providing efficient power amplification at each stage 110, 119, 124.

The multistage power amplifier 100 of this embodiment has three stages 110, 119, 124. Other embodiments may include any number of stages. The multistage power amplifier 100 of this embodiment is a MMIC. Other embodiments may feature discrete amplifier stages or discrete amplifier components. The MMIC of this embodiment is fabricated on a gallium arsenide substrate. Other embodiments may be fabricated on silicon or any other type of substrate. The amplifiers 106, 114, 120 of this embodiment are FETs. Other embodiments may feature other types of transistors amplifiers, amplifier circuits such as operational amplifiers, valve amplifiers such as traveling wave tubes or klystrons or any other type of power amplifiers.

Figure 2:
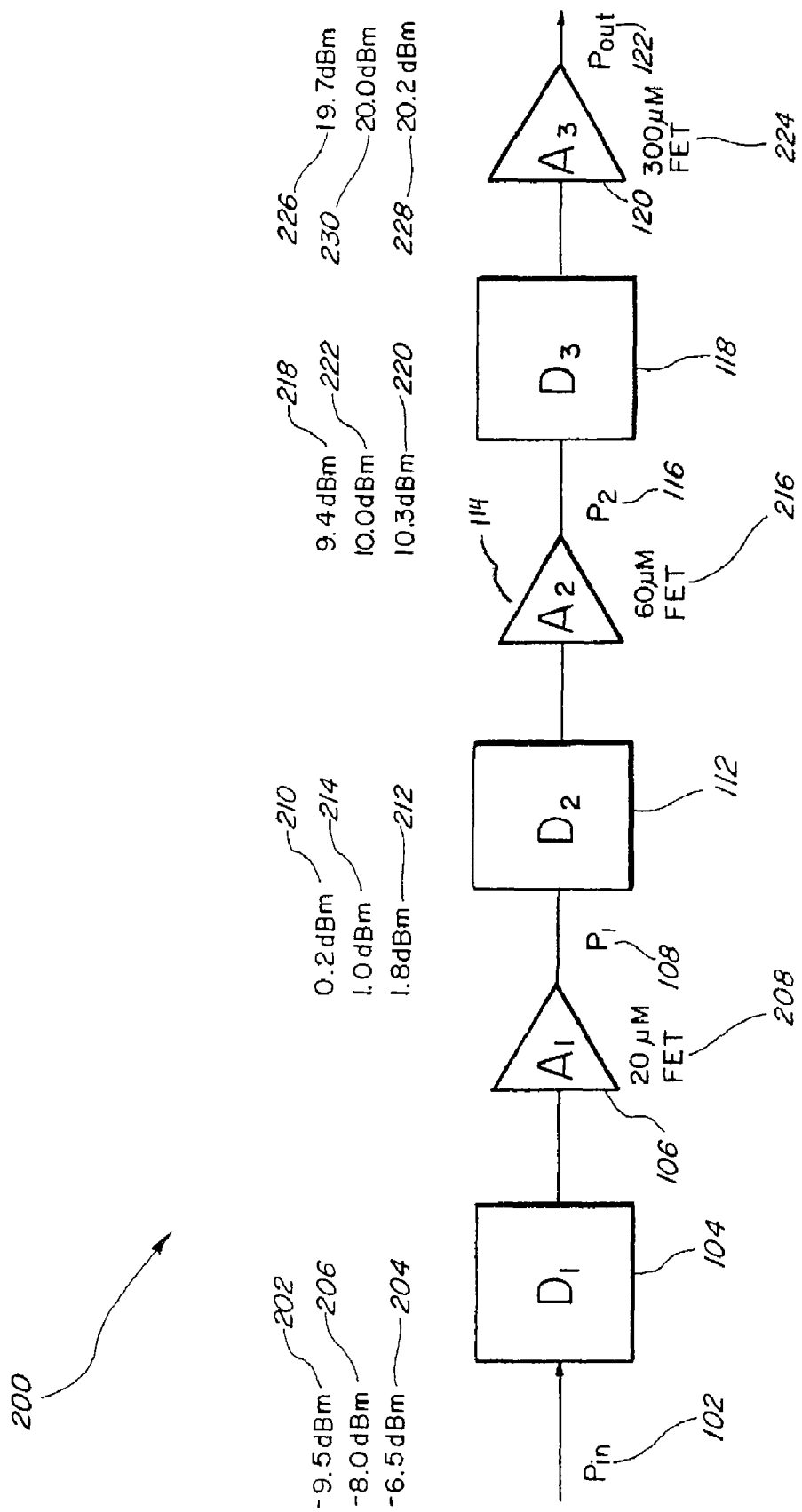
FIG. 2 shows exemplary power transfer characteristics of the exemplary multistage amplifier shown in FIG. 1.

FIG. 2 shows exemplary power transfer characteristics of the multistage amplifier 100 of FIG. 1. Input power 102 varies between −9.5 decibels with respect to one milliwatt (dBm) 202 and −6.5 dBm 204 with a nominal value of −8 dBm. The input power 102 is delivered to the first amplifier 106 through the first drive circuit 104. The first amplifier 106 has a 20 micrometer (μM) periphery 208 sized to provide the first amplifier 106 with a PAE peak that occurs with an input power at or near −8 dBm. The first amplifier 106 outputs a first stage output power 108 that varies between 0.2 dBm 210 and 1.8 dBm 212 with a nominal value of 1.0 dBm 214.

The first stage output power 108 is delivered to the second amplifier 114 through the second drive circuit 112. The second amplifier 114 has a 60 μM periphery 216 sized to provide the second amplifier 114 with a PAE peak that Occurs with an input power at or near 1.0 dBm. The second amplifier 114 outputs a second stage output power 116 that varies between 9.4 dBm 218 and 10.3 dBm 220 with a nominal value of 10.0 dBm 222.

The second stage output power 116 is delivered to the third amplifier 120 through the third drive circuit 118. The third amplifier 120 has a 300 μM periphery 224 sized to provide the third amplifier 120 with a PAE peak that occurs with an input power at or near 10.0 dBm. The third amplifier 120 outputs an output power 122 that varies between 19.7 dBm 226 and 20.2 dBm 228 with a nominal value of 20.0 dBm 230.

The transfer characteristics for the multistage amplifier 200 shown in FIG. 2 are exemplary. FET peripheries 208, 216, 224 may be sized to provide any PAE peak. Drive circuits 104, 112, 118 may also bias FET's with any periphery size. Other embodiments may feature other types of amplifiers, drive circuits or may have different power gains. Other embodiments may also feature different types of amplifiers or drive circuits with different bandwidths and power conduction or amplification characteristics.

Figure 3:
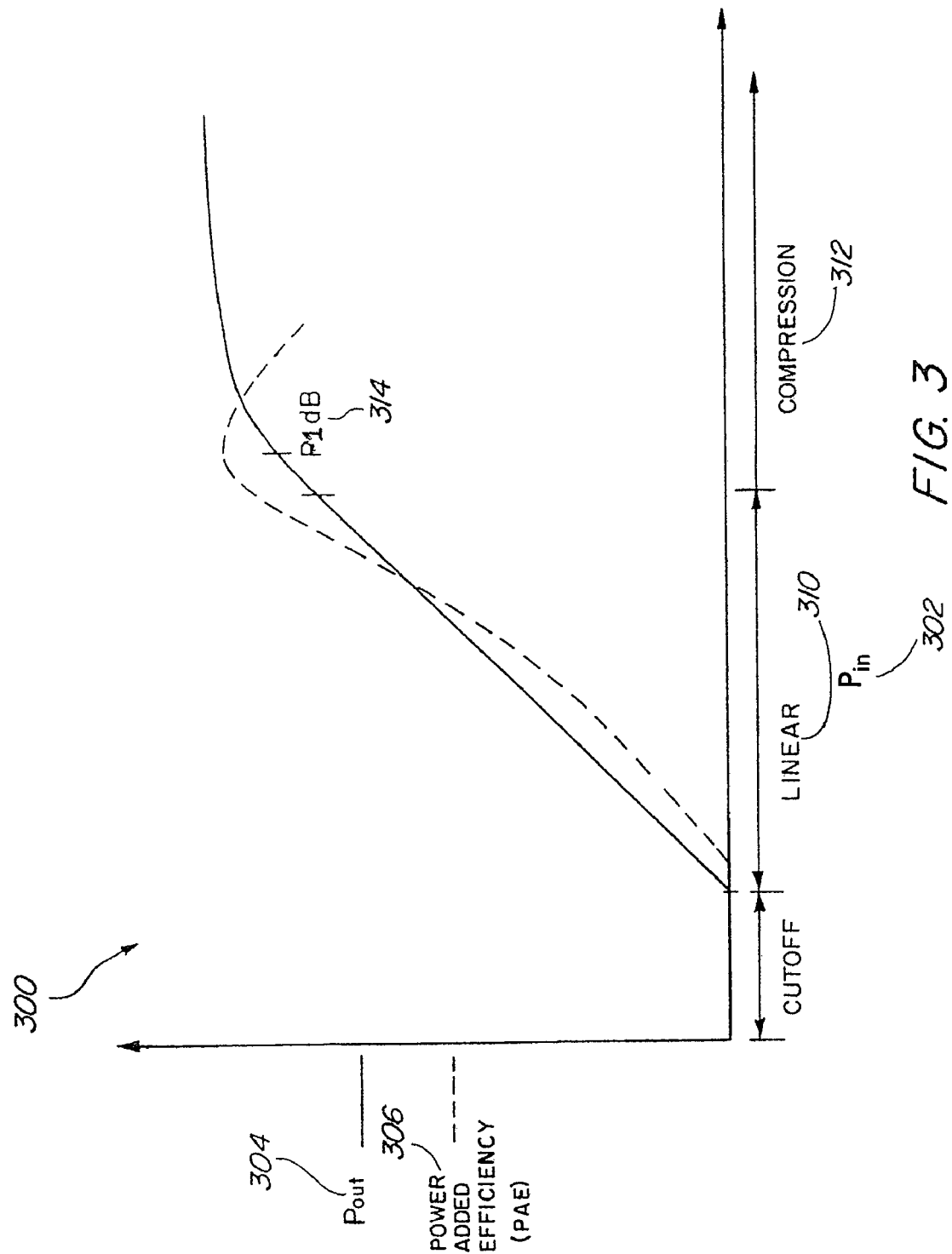
FIG. 3 shows exemplary power efficiency characteristics of one of the amplifiers shown in FIG. 1.

FIG. 3 shows an exemplary PAE characteristic plot 300 of one of the amplifiers shown in FIG. 1. The PAE characteristic plot 300 shown is for an FET power amplifier. The FET power input 302 is shown along the abscissa. The FET power output 304 and PAE 306 are shown along the ordinate.

The abscissa is divided into two sections corresponding with the operating modes of an FET.

PAE is a function of the radio frequency input power 302 ($P_{in}$), the radio frequency output power 304 ($P_{out}$) and the direct current power used by the FET ($P_{dc}$).

$$\frac{Pout - Pin}{Pdc}$$

In the linear region 310, the output power 304 varies in proportion to changes in the input power 302. That is, a marginal increase in input power 302 will result in a proportional increase in the output power 304. The PAE in this region also increases but at a rate faster than the marginal increase in input power 302. That is, a marginal increase in input power 302 in this region translates into a larger percentage of the power delivered to the FET being converted into output power 304.

In the compression region 312, the output power 304 does not respond proportionally to changes in the input power 302. That is, a marginal increase in input power 302 will result in less than a proportional increase in output power 304. The PAE in this region will continue to increase in response to increases of input power 302 until the FET is about 1 dB (P1dB 314) into the compression region 312. After P1dB 314, marginal increases in input power 302 will result in a smaller percentage of the power delivered to the FET being converted into output power.

FIG. 3 shows the response of an exemplary FET power amplifier. Other embodiments of the invention may feature other types of power amplifiers. For this exemplary FET, the PAE peak occurs at about the P1dB 314 point. Other amplifiers may have PAE peaks at other operating points. In these alternative embodiments, the amplifiers may be designed and configured to operate at or near their respective PAE peaks (e.g. within 3 dB or 5 dB).

Figure 4:
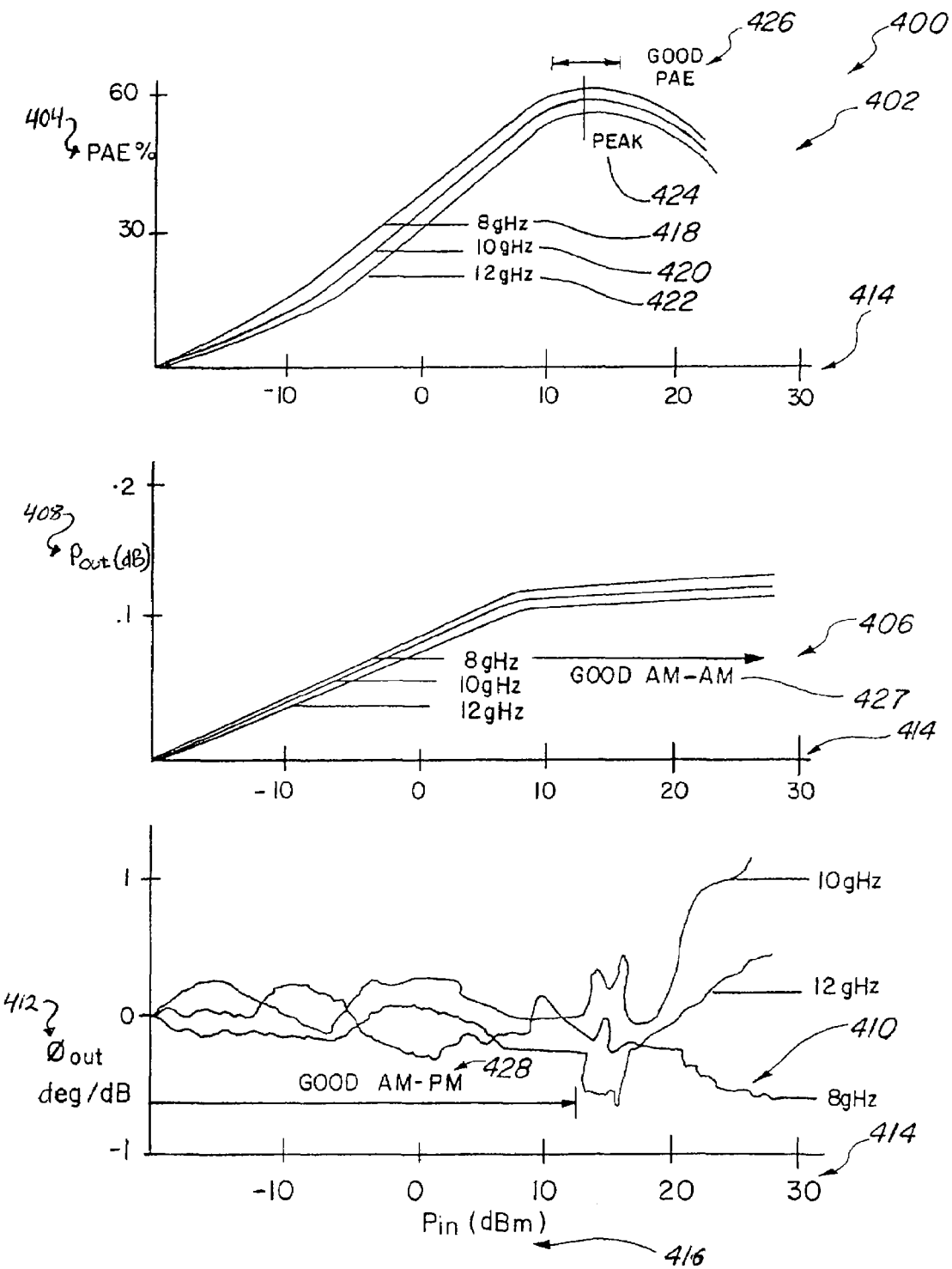
FIG. 4 shows an exemplary power transfer characteristics for one of the amplifiers shown in FIG. 1.

In accordance with an exemplary embodiment of the present invention, the multistage amplifier is designed such that each stage is tuned to achieve good PAE, good AM-AM characteristics, and good AM-PM characteristics. With reference now to FIG. 4, exemplary power transfer characteristics are shown for one of the amplifier stages described with reference to FIG. 1. The first plot 402 shows the PAE 404 response for the amplifier. The second plot 406 shows the output power 408 response for the amplifier. The third plot 410 shows the phase 412 response for the amplifier. The abscissas 414 of each of the plots 402, 406, 410 show the amplifier input power 416.

The first plot 402 shows the PAE response of the amplifier for three X band frequencies, 8 gigahertz (GHz) 418, 10 GHz 420, and 12 GHz 422. The amplifier is designed to have a PAE peak 424 when it is driven with an input power 416 of about 11 dBm. The amplifier also has good PAE 426 when it is driven with an input power 416 between about 9-13 dBm.

An amplifier with this PAE response would be a suitable choice for a power efficient multistage amplifier having a stage that amplifies X band input power waveforms that range between 9 and 13 dBm. An amplifier having this response may be a suitable choice for the third stage of the multistage amplifier shown in FIG. 2, since the third stage input power is between 9.4 and 10.3 dBm and thus the input power would fall in the good PAE 426 response region of the amplifier.

The second plot 406 shows the power output 408 (gain) response of the amplifier for each of the three X band frequencies shown in the first plot 402. For input power 416 of −20 dBm to about 9 dBm the amplifier is operating in a linear region. For input power 416 of 9 dBm or greater the amplifier is operating in a compression region. At about 8 dBm, the amplifier begins to have a good AM-AM 427 power transfer characteristics. That is, the output power does not change rapidly with an increase of input power.

It should be noted that the good AM-AM 427 zone shown in the second plot 406 overlaps the good PAE 426 zone shown in the first plot 402. Thus operating the amplifier in the good PAE 426 zone shown in the first plot 402 also delivers a power waveform having a good AM-AM response.

The third plot 410 shows the phase 412 response of the amplifier for each of the three X band frequencies shown in the first plot 402. For input power 416 up to about 13 dBm the amplifier conducts and amplifies power with very small phase change providing the amplifier with a good AM-PM 428 response. After about 13 dBm, the amplifier exhibits poor phase response providing the amplifier with a poor AM-PM power transfer characteristic.

It should be noted that the good AM-PM 428 response overlaps the good PAE 424 zone shown in plot 1. Operating the amplifier in the good PAE 426 zone also delivers a power waveform having a good AM-PM 428 response. It should also be noted that for input power 416 between 9 and 13 dBm the amplifier exhibits good PAE 426 as well as good AM-AM 427 and good AM-PM 428 response.

Figure 5:
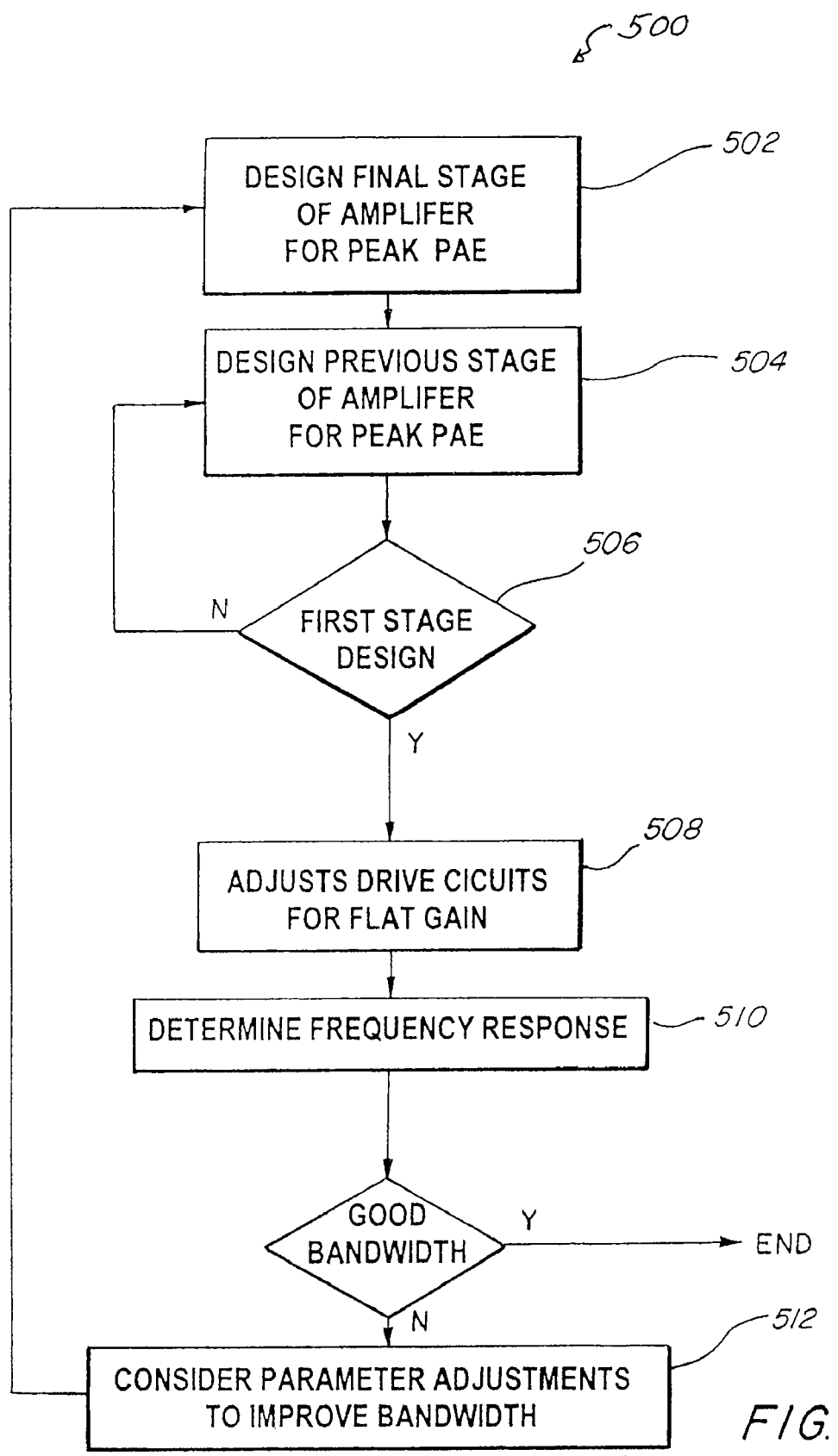
FIG. 5 shows a flow chart of an exemplary method for designing a power efficient multistage amplifier according to an exemplary embodiment of the present invention.

With reference now to FIG. 5, in accordance with an exemplary method 500 of designing a multistage amplifier, a designer designs the final stage of an amplifier for peak PAE (step 502), sequentially designs each previous stage of the amplifier for peak PAE (step 504 and 506), adjusts the drive circuits for flat gain (step 508), determines the frequency response (step 510), and/or makes adjustments to bandwidth (step 512). In one exemplary embodiment, a power engineer designs the final stage of the amplifier for peak PAE operation (step 502). To do this, the engineer determines the input impedance of a load the multistage amplifier will be required to drive. This determines the desirable output impedance for the final stage amplifier. The engineer also determines the amount of power required to drive the load.

A final stage power amplifier and drive circuit may then be designed, preferably using a high frequency simulation design tool. For example, if the final stage will feature an FET power amplifier the engineer sizes, designs and models the FET with the design tool. An appropriate drive circuit may also be designed and modeled. The engineer may then use the design tool to make sure that the FET and drive circuit have a flat gain response over the expected input power ranges and good frequency response over the expected input frequency ranges.

After designing the final stage of the amplifier the power engineer then designs a penultimate (or previous) stage of the amplifier for peak PAE operation (step 504). To do this, the engineer analyzes the input impedance of the load (i.e. the input impedance of the final or next stage) to determine a matching output impedance. The engineer also determines the output power required to drive the final (or next stage) at or near PAE. The engineer also analyzes the power input to the multistage amplifier to determine if adequate amplification may be made in this stage or if additional stages will be needed.

The amplifier and drive circuit for this stage may then be designed using a high frequency simulation design tool. For example, if the final stage will feature an FET power amplifier the engineer will size and model the FET with the design tool. An appropriate drive circuit may also be modeled. The engineer may use the design tool to make sure that the FET has a flat gain response over the expected power ranges and good frequency response over the expected frequency ranges.

It should be noted that from stage to stage the size of the FET and the drive circuit may vary to allow each amplifier to conduct and amplify different power ranges, to obtain different desired gains and to insure that the FET is operating at or near peak PAE. For example, one stage may feature an FET having a 20 µM periphery and a 1.5 V drain voltage while another stage may feature an FET having a 60 µM periphery and a 3.5 V drain voltage. In one exemplary embodiment, for each stage of the multistage amplifier to operate at peak PAE, in many designs the FET periphery size may increase monotonically from stage to stage.

After designing this stage, the power engineer determines if more amplification and hence more stages are needed. If so, the engineer repeats the design for an additional stage as explained above.

The power engineer then adjusts the drive circuits (and amplifier design if necessary) to obtain a flat gain response (step 508). Although each stage should have a flat gain response, the engineer now models the entire multistage amplifier and adjusts each of the drive circuits to obtain a flat gain response. The engineer may also model any device that may drive the multistage amplifier to optimize the gain response for use with that particular device. The engineer should be sensitive to how gain responses affect the PAE response when making drive circuit adjustments.

The power engineer also determines the frequency response (step 510) of the multistage power amplifier. The engineer may use the high frequency analysis tool to analyze the frequency response. If the response is good over the expected operating bandwidth, the engineer has completed the design. If not, the engineer notes the frequency response problem areas and repeats the design process with attention to these problem areas.

The result of this design method is a power efficient multistage power amplifier. Each stage of the power amplifier operates at or near its PAE peak. This provides a highly efficient multistage power amplifier suitable for use in power critical operations such as space applications. The method also provides an amplifier with good AM-AM and good AM-PM power transfer characteristics and good frequency response. The method, although applicable to the design of all multistage amplifiers, is especially applicable to the design of highly efficient monolithic high frequency power amplifiers in the X band and higher.

In the foregoing specification, the invention has been described with reference to specific embodiments. However, it may be appreciated that various modifications and changes may be made without departing from the scope of the present invention. The specification and figures are to be regarded in an illustrative manner, rather than a restrictive one, and all such modifications are intended to be included within the scope of present invention. Accordingly, the scope of the invention should be determined by the appended claims and their legal equivalents, rather than by the examples given above. For example, the steps recited in any of the method or process claims may be executed in any order and are not limited to the order presented.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. A multistage amplifier comprising:
   a first amplifier stage having,
      a first amplifier with a first amplifier output; and
   a second amplifier stage connected with the first amplifier stage having,
      a second amplifier with a second amplifier output, and
      wherein the second amplifier is configured to drive the first amplifier within 5 dB of the first amplifier power added efficiency peak, and wherein each amplifier stage in said multistage amplifier is driven within 5 dB of that amplifier stage power added efficiency peak; and
   wherein the second amplifier stage of the multistage amplifier further comprises a periphery for a second field effect transistor sized to obtain a substantially flat gain response for power levels within 3 dB of the first amplifier stage's power added efficiency peak.

2. The multistage amplifier of claim 1 wherein the first amplifier and the second amplifier each comprise a field effect transistor.

3. The multistage amplifier of claim 2 wherein the first amplifier and the second amplifier each comprise a high electron mobility field effect transistor.

4. The multistage amplifier of claim 1 wherein the first amplifier stage, the second amplifier stage or both are monolithic microwave integrated circuits.

5. The multistage amplifier of claim 3 wherein the first amplifier stage, the second amplifier stage or both have a gallium arsenide substrate.

6. The multistage amplifier of claim 1 wherein power added efficiency peak of the first and second amplifiers is 0 to 2 dB above a linear operating region.

7. The multistage amplifier of claim 1 further comprising a third amplifier stage connected with the second amplifier stage having;
   a third amplifier with a third amplifier output, and
   wherein the third amplifier is configured to drive the second amplifier within 5 dB of the second amplifier power added efficiency peak.

8. A method for designing a multistage amplifier comprising:
   designing a final stake of the multistage amplifier to drive a load and operate within 5 dB of a final stage power added efficiency peak; and
   designing a penultimate stage of the multistage amplifier to drive the final stage of the amplifier and operate within 5 dB of a penultimate stage power added efficiency peak, wherein designing the penultimate stage of the multistage amplifier further comprises sizing a periphery for a second field effect transistor and designing a second drive circuit to obtain a substantially flat gain response for power levels within 3 dB of the penultimate stage's power added efficiency peak.

9. The method of claim 8 further comprising designing an input circuit to drive a first stage of the multistage amplifier to obtain a flat gain response.

10. The method of claim 9 further comprising determining a frequency response of one or more stages of the multistage amplifier.

11. The method of claim 10 further comprising adjusting one or more design parameters to adjust the frequency response.

12. The method of claim 11 wherein a computer simulation tool is used to design one or more stages of the multistage amplifier.

* * * * *

UNITED STATES PATENT AND TRADEMARK OFFICE
CERTIFICATE OF CORRECTION

PATENT NO. : 7,583,150 B2
APPLICATION NO. : 11/688729
DATED : September 1, 2009
INVENTOR(S) : Kenneth V. Buer et al.

It is certified that error appears in the above-identified patent and that said Letters Patent is hereby corrected as shown below:

In column 8, claim 8, line 29, "stake" should be changed to -- stage --.

Signed and Sealed this

Sixth Day of October, 2009

David J. Kappos
*Director of the United States Patent and Trademark Office*